(12) United States Patent
Asada

(10) Patent No.: US 12,720,931 B2
(45) Date of Patent: Aug. 25, 2026

(54) METHOD FOR MANUFACTURING A DISPLAY DEVICE AND DISPLAY DEVICE

(71) Applicant: Japan Display Inc., Tokyo (JP)

(72) Inventor: Keisuke Asada, Tokyo (JP)

(73) Assignee: Japan Display Inc., Tokyo (JP)

( * ) Notice: Subject to any disclaimer, the term of this patent is extended or adjusted under 35 U.S.C. 154(b) by 430 days.

(21) Appl. No.: 18/346,294

(22) Filed: Jul. 3, 2023

(65) Prior Publication Data

US 2023/0343907 A1 Oct. 26, 2023

Related U.S. Application Data

(63) Continuation of application No. PCT/JP2021/046033, filed on Dec. 14, 2021.

(30) Foreign Application Priority Data

Jan. 5, 2021 (JP) ................................ 2021-000443

(51) Int. Cl.

| | |
|---|---|
| ***H10H 20/854*** | (2025.01) |
| ***H10H 20/01*** | (2025.01) |
| ***H10H 20/857*** | (2025.01) |
| ***H10W 90/00*** | (2026.01) |

(52) U.S. Cl.

CPC .......... *H10H 20/854* (2025.01); *H10W 90/00* (2026.01); *H10H 20/0362* (2025.01)

(58) Field of Classification Search

CPC .............. H01L 25/0753; H10K 59/873; H10K 77/111; H10K 59/1201; H10H 20/0362; H10H 20/857; H10H 20/0364; H10H 20/01; H10H 20/854; H10H 20/018–036; H10W 90/00

See application file for complete search history.

(56) References Cited

U.S. PATENT DOCUMENTS

2010/0277855 A1 11/2010 Lim et al.
2018/0108640 A1 4/2018 Odaka
2018/0284515 A1 10/2018 Higano et al.
2019/0115274 A1* 4/2019 Hu .......................... H01L 24/16
2019/0342434 A1 11/2019 Zou et al.
2020/0058886 A1* 2/2020 Yuan ...................... H10K 71/00
2021/0043616 A1* 2/2021 Jung ...................... H10H 20/01
2021/0082892 A1 3/2021 Kanaya et al.

(Continued)

OTHER PUBLICATIONS

International Search Report mailed on Feb. 15, 2022, for the corresponding PCT Application No. PCT/JP2021/046033, with English machine translation.

(Continued)

*Primary Examiner* — Sonya McCall-Shepard
(74) *Attorney, Agent, or Firm* — Michael Best & Friedrich LLP

(57) ABSTRACT

According to one embodiment, a method for manufacturing a display device, includes attaching a protective film on a surface of a backplane including a plurality of flexible backplanes formed on a glass substrate, cutting out the plurality of flexible backplanes from the backplane on which the protective film is attached, peeling the protective film off from each of the flexible backplanes and constituting a display device including an LED chip using the flexible backplane in a state that the protective film is peeled off.

13 Claims, 12 Drawing Sheets

(56) References Cited

U.S. PATENT DOCUMENTS

| | | | |
|---|---|---|---|
| 2021/0210522 | A1 | 7/2021 | Liu et al. |
| 2022/0005994 | A1 | 1/2022 | Morita et al. |

OTHER PUBLICATIONS

English machine translation of the Japanese Office Action mailed on Aug. 20, 2024, for the corresponding Japanese Patent Application No. 2021-000443.

* cited by examiner

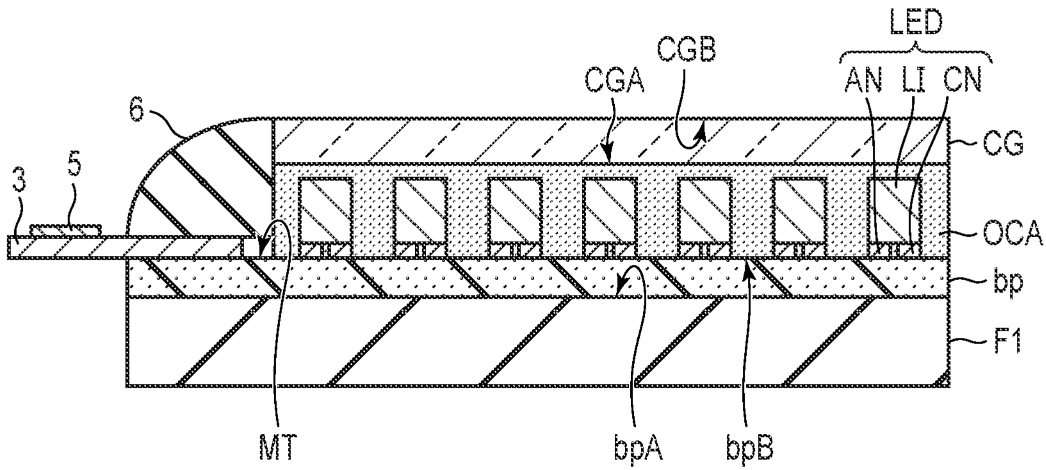
F I G. 2

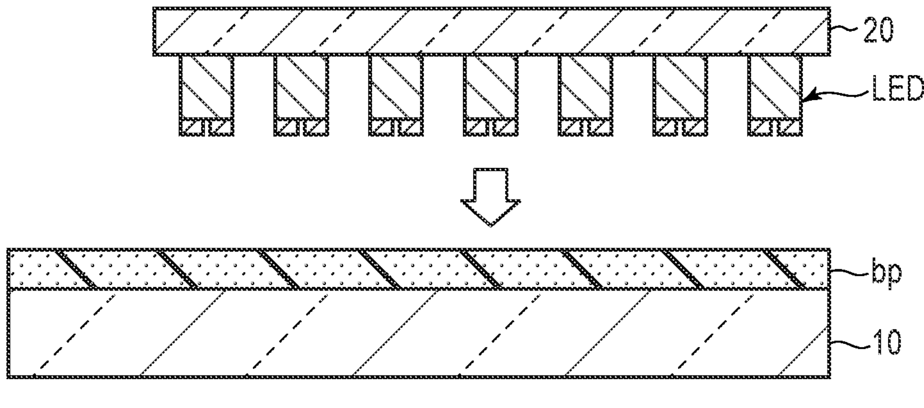
F I G. 4
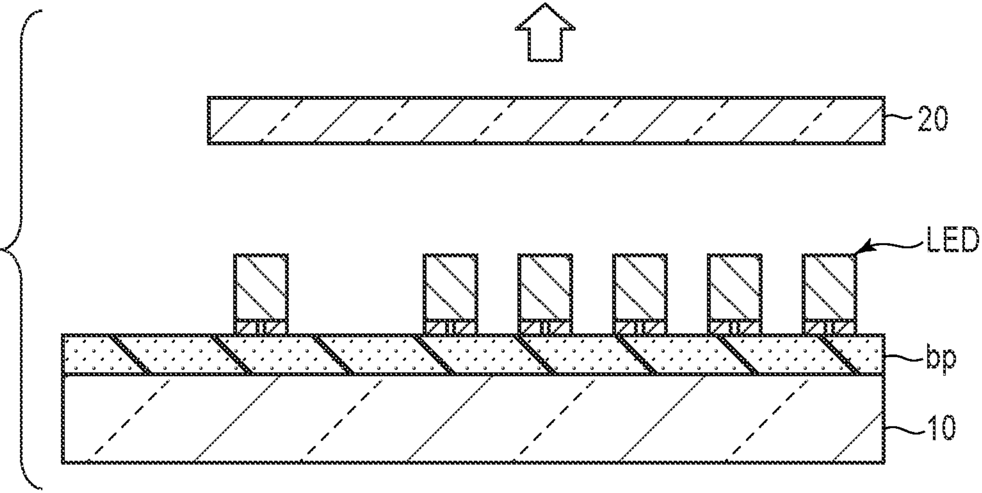
F I G. 5

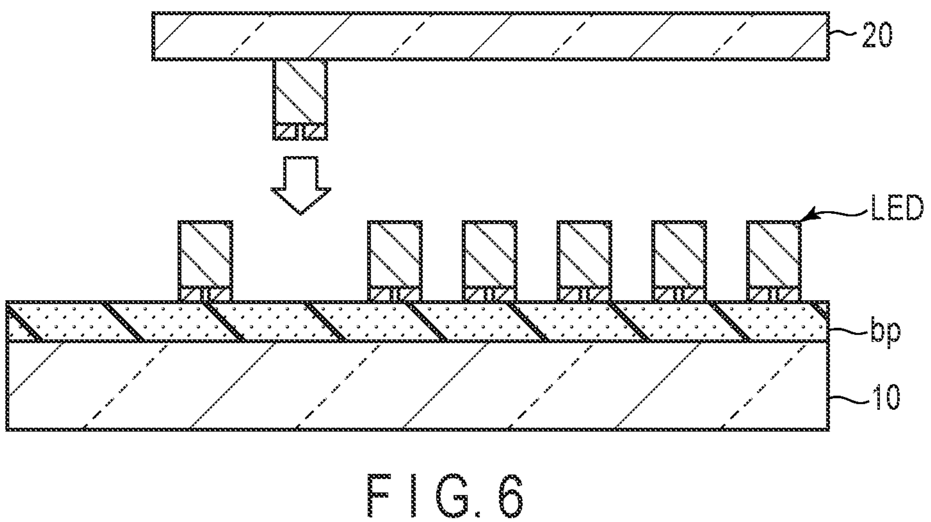
F I G. 6
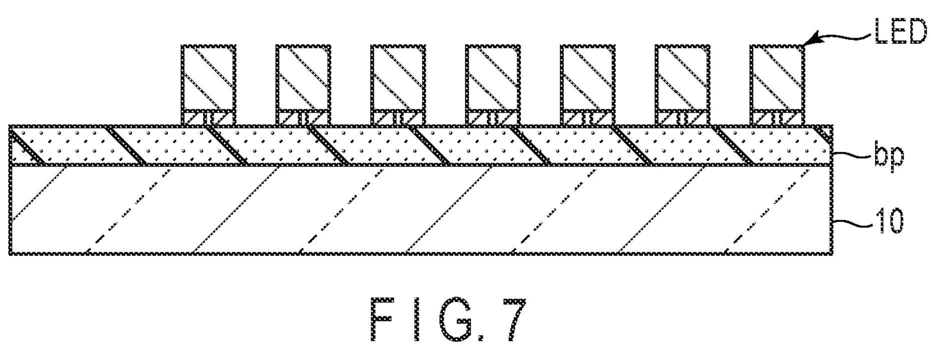
F I G. 7
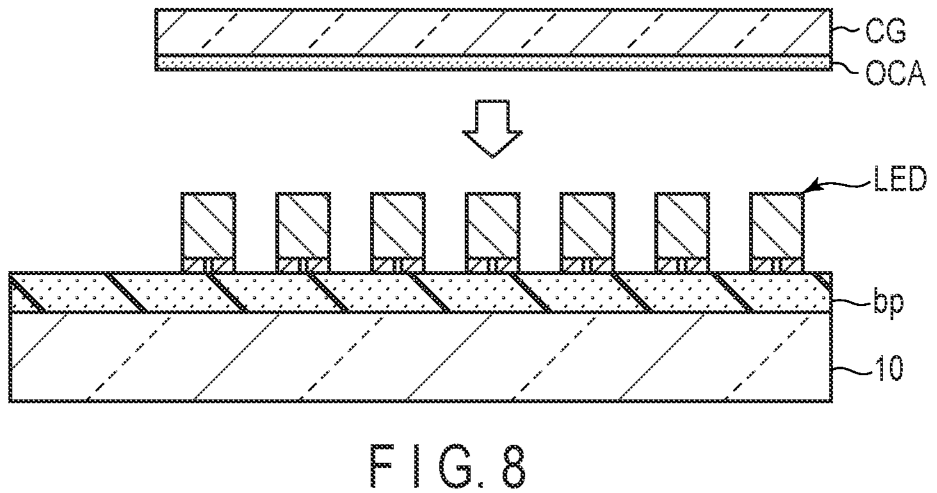
F I G. 8

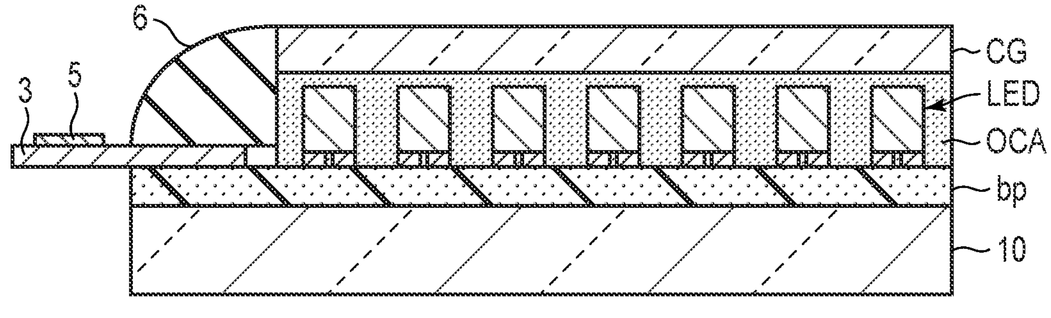
F I G. 11
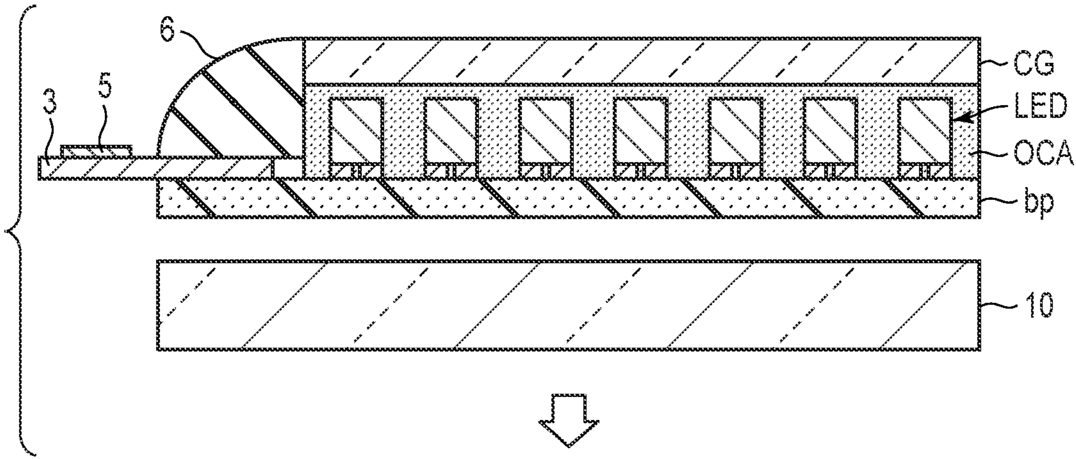
F I G. 12

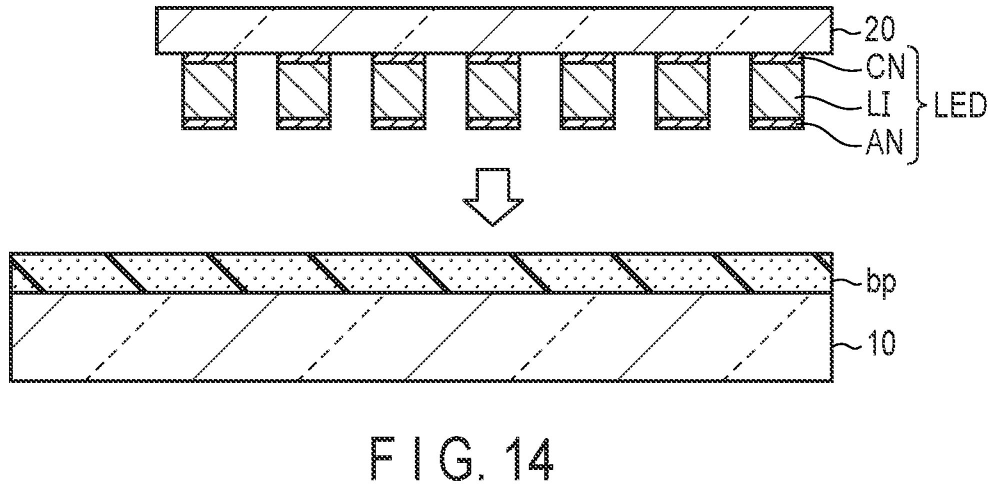
F I G. 14
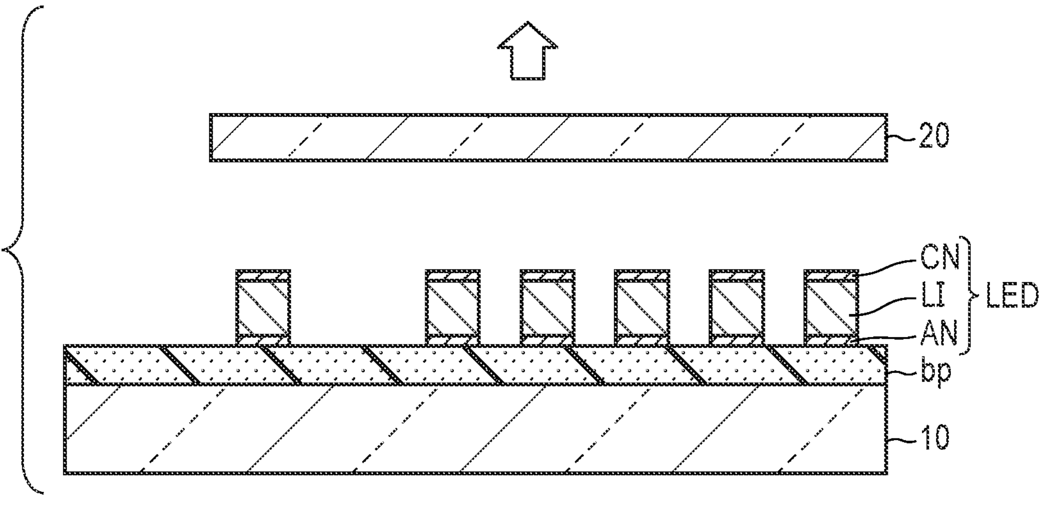
F I G. 15

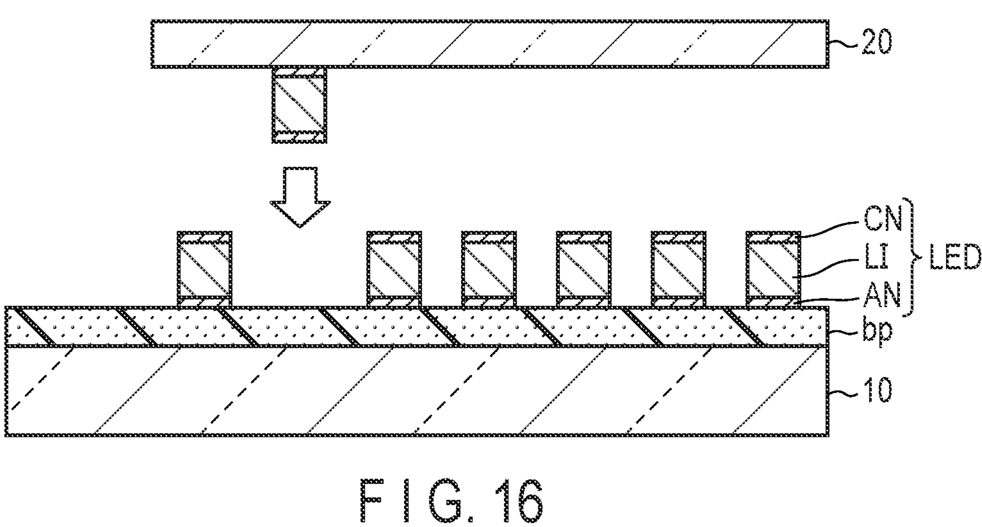
F I G. 16
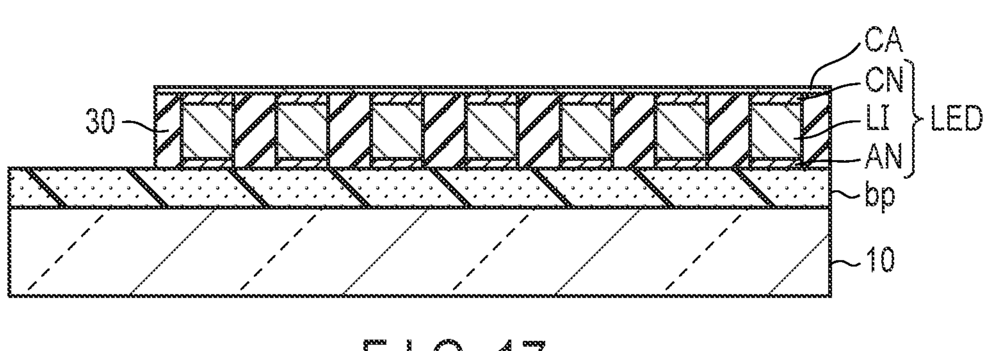
F I G. 17
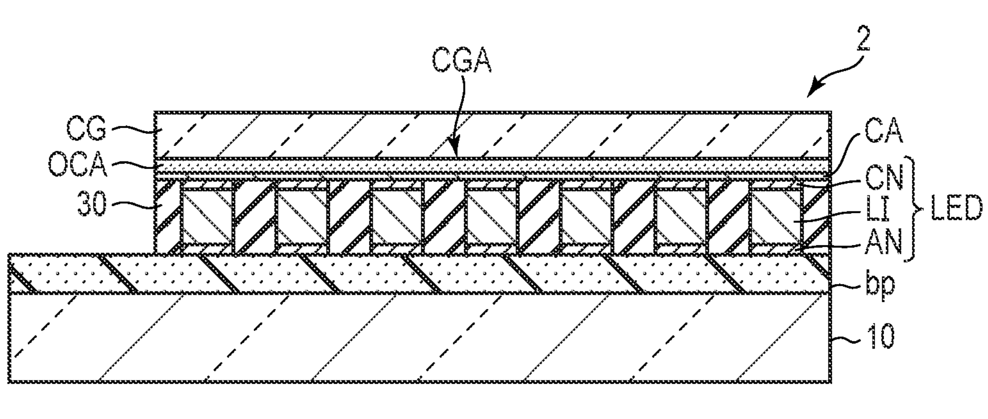
F I G. 18

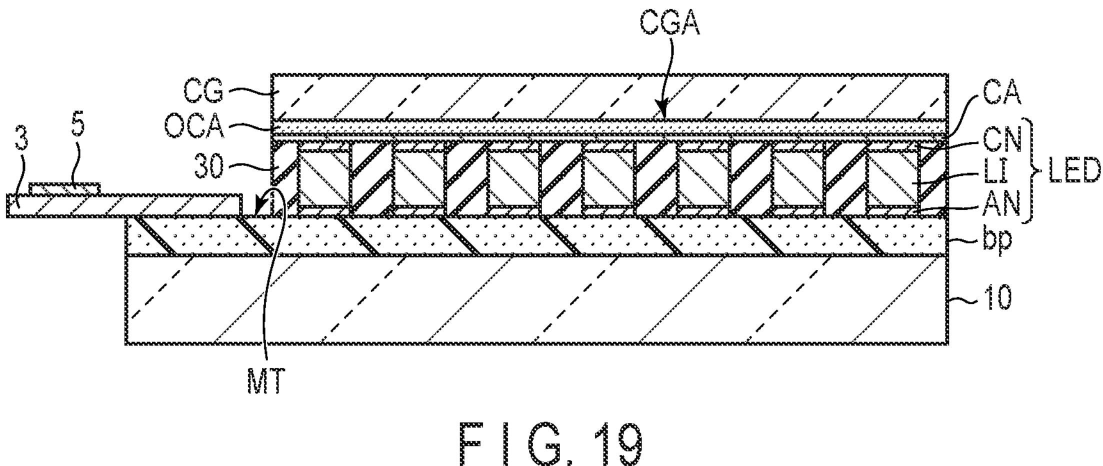
F I G. 19
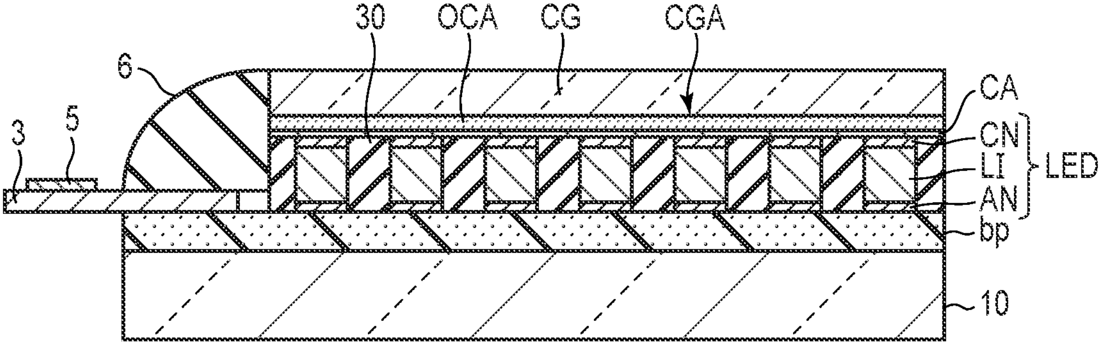
F I G. 20

METHOD FOR MANUFACTURING A DISPLAY DEVICE AND DISPLAY DEVICE

CROSS-REFERENCE TO RELATED APPLICATIONS

This application is a Continuation Application of PCT Application No. PCT/JP2021/046033, filed Dec. 14, 2021 and based upon and claiming the benefit of priority from Japanese Patent Application No. 2021-000443, filed Jan. 5, 2021, the entire contents of all of which are incorporated herein by reference.

FIELD

Embodiments described herein relate generally to a method for manufacturing a display device and the display device.

BACKGROUND

Generally, LED displays that employ light emitting diodes (LEDs), which are self-luminous elements, are known. But, in recent years, as a display device with higher resolution, a display device employing minute diode elements, which are referred to as micro-LEDs (to be referred to as a micro-LED display hereinafter) has been developed.

Such micro-LED displays, unlike the conventional liquid crystal displays or the organic electroluminescent displays, are formed by mounting a large number of chip-like micro-LEDs in the display area, making it easy to achieve both higher resolution and larger size, and they are attracting attention as next-generation displays.

BRIEF DESCRIPTION OF THE DRAWINGS

FIG. 2 is a cross-sectional view schematically showing the configuration of the display device according to the embodiment.

FIG. 4 is a cross-sectional view illustrating the method for manufacturing the display device according to the embodiment.

FIG. 5 is another cross-sectional view illustrating the method for manufacturing the display device according to the embodiment.

FIG. 6 is still another cross-sectional view illustrating the method for manufacturing the display device according to the embodiment.

FIG. 7 is still another cross-sectional view illustrating the method for manufacturing the display device according to the embodiment.

FIG. 8 is still another cross-sectional view illustrating the method for manufacturing the display device according to the embodiment.

FIG. 11 is still another cross-sectional view illustrating the method for manufacturing the display device according to the embodiment.

FIG. 12 is still another cross-sectional view illustrating the method for manufacturing the display device according to the embodiment.

FIG. 14 is still another cross-sectional view illustrating the method for manufacturing the display device according to the embodiment.

FIG. 15 is still another cross-sectional view illustrating the method for manufacturing the display device according to the embodiment.

FIG. 16 is still another cross-sectional view illustrating the method for manufacturing the display device according to the embodiment.

FIG. 17 is still another cross-sectional view illustrating the method for manufacturing the display device according to the embodiment.

FIG. 18 is still another cross-sectional view illustrating the method for manufacturing the display device according to the embodiment.

FIG. 19 is still another cross-sectional view illustrating the method for manufacturing the display device according to the embodiment.

FIG. 20 is still another cross-sectional view illustrating the method for manufacturing the display device according to the embodiment.

DETAILED DESCRIPTION

Figure 1:
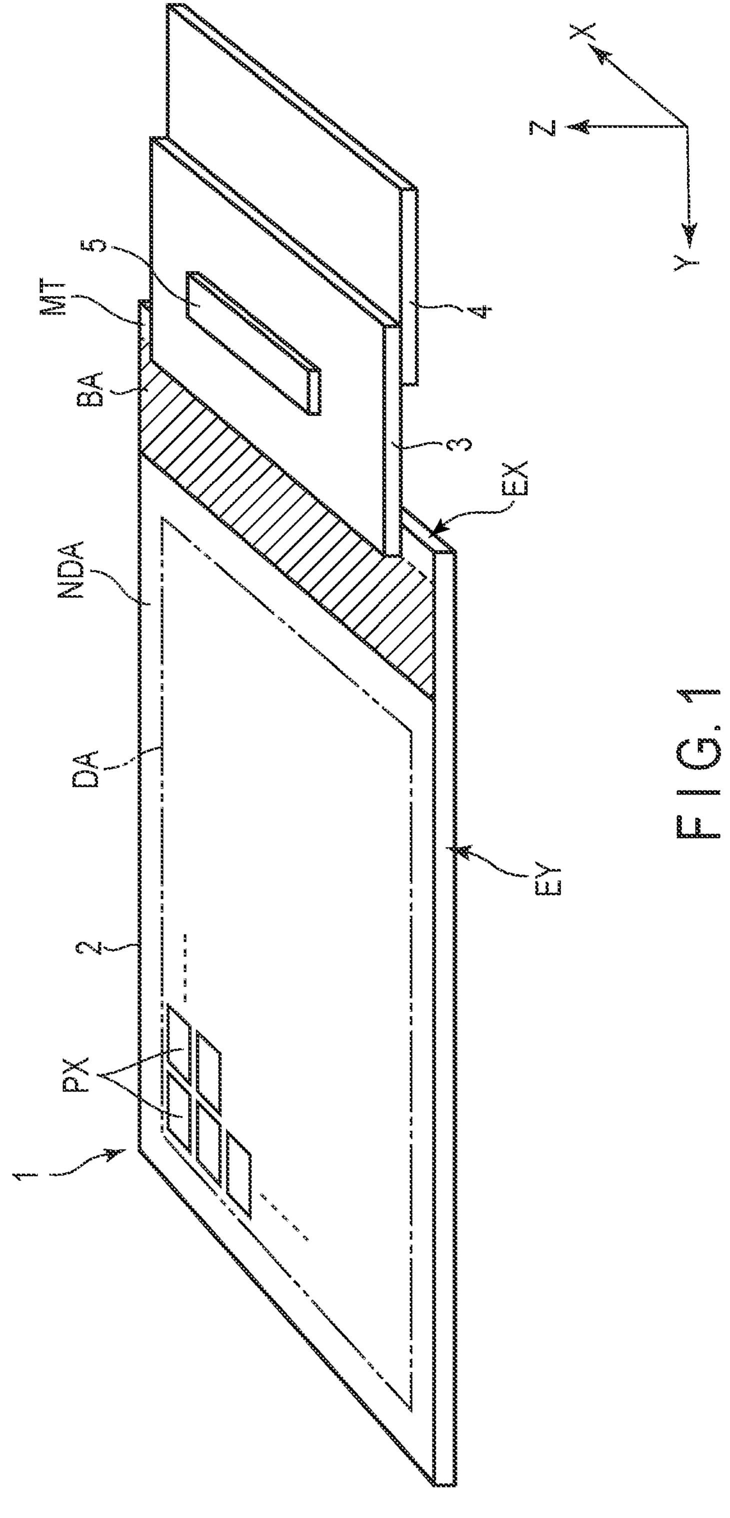
FIG. 1 is a perspective view schematically showing a configuration of a display device according to an embodiment.

In general, according to one embodiment, a method for manufacturing a display device, comprises attaching a protective film on a surface of a backplane including a plurality of flexible backplanes formed on a glass substrate, cutting out the plurality of flexible backplanes from the backplane on which the protective film is attached, peeling the protective film off from each of the flexible backplanes and constituting a display device comprising an LED chip using the flexible backplane in a state that the protective film is peeled off.

According to another embodiment, a method for manufacturing a display device, comprises attaching bonding two backplanes each including a plurality of flexible backplanes formed on a glass substrate so that the plurality of flexible backplanes oppose each other, respectively, shaving glass substrate portions of the two backplanes, cutting out the plurality of flexible backplanes from the two backplanes and constituting a display device comprising a LED chip using the cut-out flexible backplane.

According to still another embodiment, a display device comprises a flexible backplane having flexibility, a plurality of LED chips mounted on the flexible backplane, a cover member disposed over the plurality of LED chips, a circuit board mounted on a region of the flexible backplane, which does not overlap the plurality of LED chips and the cover member in plan view, a resin member which connects a side surface of the cover member and a surface of the circuit board to each other and a support film disposed under the flexible backplane.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a perspective view schematically showing a configuration of a display device 1 according to one embodiment. FIG. 1 illustrates a three-dimensional space defined by a first direction X, a second direction Y perpendicular to the first direction X and a third direction Z perpendicular to the first direction X and the second direction Y. Note that the first direction X and the second direction Y are orthogonal to each other, but they may intersect at an angle other than 90 degrees. In the following descriptions, viewing the display device 1 from a direction parallel to the third direction Z is referred to as plan view.

The description of this embodiment is mainly directed to an example case where the display device 1 is a micro-LED display that employs micro-LEDs, which are self-luminous elements.

Note that the micro-LEDs may be referred to simply as light emitting elements or LED chips.

As shown in FIG. 1, the display device 1 comprises a display panel 2, a first circuit board 3, a second circuit board 4 and the like.

The display panel 2 is, for example, rectangular. In the example illustrated, a short side EX of the display panel 2 is parallel to the first direction X, and a long side EY of the display panel 2 is parallel to the second direction Y. The third direction Z corresponds to the thickness direction of the display panel 2. The first direction X may be read to mean to be parallel to the short side of the display device 1, the second direction Y may be read to mean to be parallel to the long side of the display device 1, and the third direction Z may be read to mean to be the thickness direction of the display device 1. The main surface of the display panel 2 is parallel to the X-Y plane defined by the first direction X and the second direction Y. The display panel 2 includes a display area DA (display portion) and a non-display area NDA (non-display portion) on an outer side of the display area DA. The non-display area NDA includes a terminal area MT. In the example illustrated, the non-display area NDA surrounds the display area DA.

The display area DA is an area that displays images and comprises a plurality of pixels PX arranged in a matrix, for example. The pixels PX each include an LED chip (light emitting element or micro-LED), a switching element (drive transistor) for driving the light emitting element, and the like.

The terminal area MT is provided along the short side EX of the display panel 2 and includes terminals for electrically connecting the display panel 2 to an external device and the like.

The first circuit board 3 is mounted on the terminal area MT and electrically connected to the display panel 2. The first circuit board 3 is, for example, a flexible printed circuit board. The first circuit board 3 comprises a drive IC chip(, which will be referred to as a panel driver, hereinafter) 5 that drives the display panel 2, and the like. In the example illustrated, the panel driver 5 is located on the first circuit board 3, but it may as well be located below the first circuit board 3. Or, the panel driver 5 may as well be mounted on somewhere other than the first circuit board 3. In this case, the panel driver 5 may be mounted in the non-display area NDA of the display panel 2 or mounted on the second circuit board 4. The second circuit board 4 is, for example, a rigid printed circuit board. The second circuit board 4 is connected to the first circuit board 3, for example, below the first circuit board 3.

The panel driver 5 is connected to a control board, which is not shown, via the second circuit board 4, for example. The panel driver 5 executes control for displaying images on the display panel 2 by driving a plurality of pixels PX based on video signals output from the control board, for example.

Note that the display panel 2 may include a bend area BA shown by hatch lines. The bend area BA is an area that is bent when the display device 1 is accommodated in a housing such as of an electronic device. The bend area BA is located on a terminal area MT side of the non-display area NDA. While the bend area BA is bent, the first circuit board 3 and the second circuit board 4 are arranged to oppose the display panel 2.

In this embodiment, a method for manufacturing the display device 1 described above will be described. In the following descriptions, first, a schematic configuration of the display device 1 in cross-sectional view will be illustrated with reference to FIG. 2.

FIG. 2 is a cross-sectional view schematically showing the configuration of the display device 1.

As shown in FIG. 2, the display device 1 comprises a display panel 2, a first circuit board 3, a panel driver 5 and a resin member 6. Note here that the illustration of the second circuit board 4 is omitted from FIG. 2, but, in reality, as shown in FIG. 1, the display device 1 comprises a second circuit board 4 that is connected to the first circuit board 3.

The display panel 2 comprises a backplane bp, a plurality of light emitting elements LED, a cover member CG, an adhesive layer OCA and a support film F1.

The backplane bp includes a first main surface bpA and a second main surface bpB located on an opposite side to the first main surface bpA. Although an illustration thereof is omitted from the example illustrated, switching elements and various wiring patterns for driving the light emitting elements LED are formed on the backplane bp. The backplane bp has excellent flexibility and is formed of, for example, polyimide resin. The backplane bp may as well be referred to as a flexible backplane or array substrate.

The light emitting elements LED are provided on the second main surface bpB of the backplane bp. The light emitting elements LED include those having emitting colors of red (R), green (G) and blue (B). The light emitting elements LED each include a light emitting layer LI, an anode terminal AN and a cathode terminal CN. The light emitting layers LI emit light of colors R, G and B. The anode terminal AN and cathode terminal CN are electrically connected to switching elements and various wiring patterns formed on the backplane bp. In FIG. 2, it is assumed that the light emitting element LED is a micro-LED of a type in which both the anode terminal AN and the cathode terminal CN are arranged side by side on one surface of the light emitting layer LI.

The cover member CG includes a first main surface CGA and a second main surface CGB located on an opposite side of the first main surface CGA. The first main surface CGA of the cover member CG opposes the second main surface bpB of the backplane bp. The backplane bp and the cover member CG are bonded by an adhesive layer OCA. The cover member CG is formed, for example, of a glass substrate or a plastic substrate.

The support film F1 is provided on the first main surface bpA side of the backplane bp and supports the flexible backplane bp.

On the second main surface bpB of the backplane bp, the terminal area MT is provided. In the terminal area MT, the first circuit board 3 is disposed. On the first circuit board 3, the panel driver 5 is disposed. The resin member 6 is arranged to integrate the display panel 2 and the first circuit board 3 together. With this configuration, the rigidity of the first circuit board 3 mounted on the terminal area MT can be reinforced, thereby making it possible to prevent the first circuit board 3 from breaking and being damaged.

In the following descriptions, with reference to FIGS. 3 to 12, the processing steps by which the display device 1 shown in FIG. 2 is manufactured will be described in sequence. FIGS. 3 to 12 are diagrams showing an example of the manufacturing process of the display device 1 in order.

Figure 3:
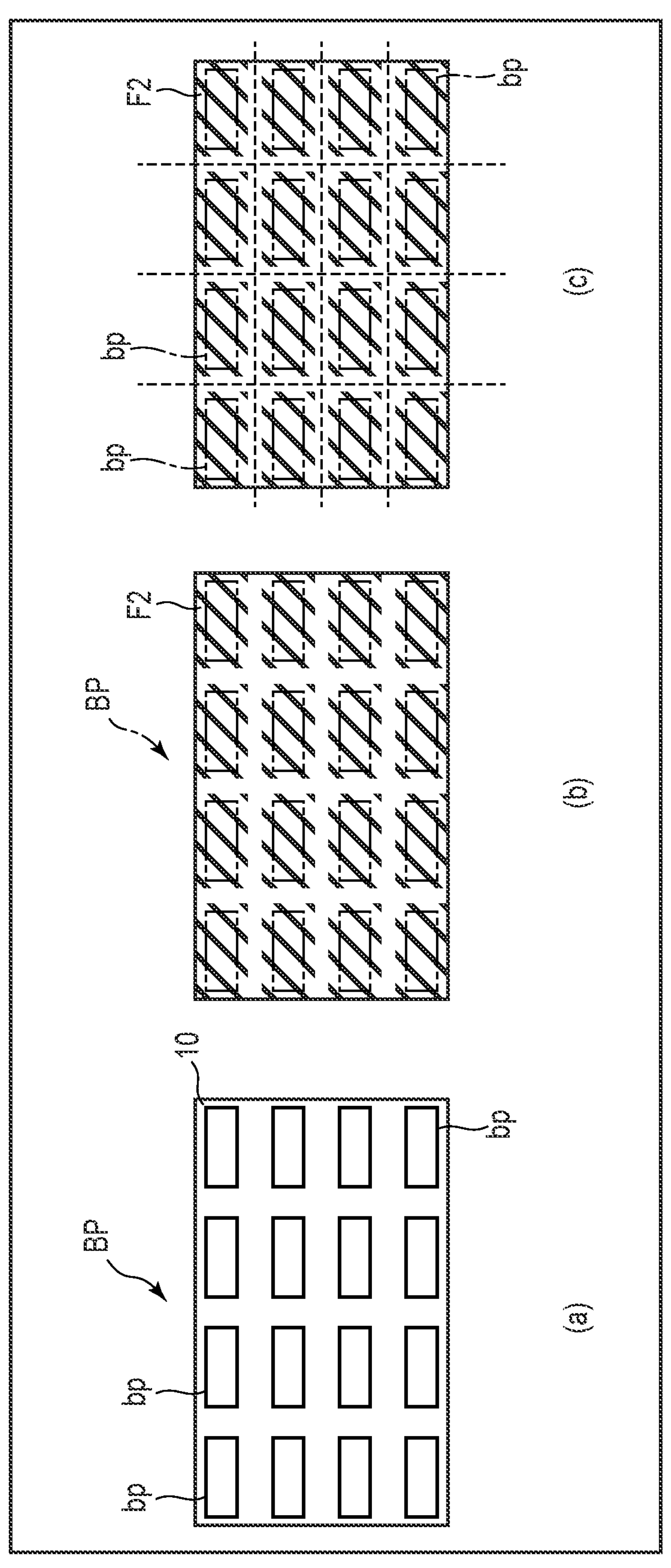
FIG. 3 is a plan view illustrating a method for manufacturing the display device according to an embodiment.

First, a cut-out process of the backplane bp (the first processing step) is carried out. More specifically, as shown in FIG. 3, parts (a) and (b), on a large-sized backplane BP on which a number of backplanes bp are formed on the glass substrate 10, a protective film F2 is attached to a second main surface bpB side thereof. Here, it is desirable that the protective film F2 should be attached to each backplane bp one by one, but it may as well do that it is attached over the entire surface of the large-sized backplane BP. The protective film F2 is a film for protecting the surface of the backplane bp. More precisely, the protective film F2 is a film for protecting switching elements and various wiring patterns formed on the surface of the backplane BP, and while the protective film F2 is being attached, the light emitting element LED is not mounted on the backplane BP. After the protective film F2 is attached, the large-sized backplane BP is cut into individual pieces to form a number of backplanes bp, as shown in FIG. 3, part (c). Note that the protective film F2 is peeled off from the surface of the backplane bp and removed after cutting.

As shown in the first processing step, the backplane bp is formed by cutting the backplane BP into pieces while the protective film F2 being attached to its surface. With this configuration, the surface of the backplane bp can be protected from glass cullet generated when the glass substrate 10 contained in the backplane BP is cut. Therefore, a polishing process for removing glass cullet attached to the surface (the second main surface bpB) of the backplane bp, which would be a necessary process in an ordinary situation, can be omitted.

Next, a mounting process of the light emitting elements LED (the second processing step) is carried out. More specifically, as shown in FIG. 4, a plurality of light emitting elements LEDs arranged on a sapphire substrate 20 as the base substrate of the LED wafer are mounted on the backplane bp. Here, the "mounting" refers to the state of joining the light emitting element LEDs and the backplane bp, where the light emitting element LEDs are connected and fixed to the backplane bp. The mounting of the light emitting element LEDs and the backplane bp is carried out by laser irradiation from the sapphire substrate 20 to the glass substrate 10 or from the glass substrate 10 to the sapphire substrate 20, in which the electrodes provided on the second surface bpB of the backplane bp are bonded respectively to the terminals of the light emitting elements LED. When a plurality of light emitting element LEDs are mounted on the backplane bp, a laser beam of a predetermined wavelength band is irradiated from the sapphire substrate 20 side toward the plurality of light emitting elements LED. Thus, a peel-off layer, not shown in the figure, which fixedly adhering the light emitting element LEDs to the sapphire substrate 20, is sublimed by laser ablation. Thus, the sapphire substrate 20 is peeled off from the plurality of light emitting element LEDs, as shown in FIG. 5. Once the sapphire substrate 20 is peeled off, the display panel 2 is chamfered to trim the outline of the display panel 2. With this process, the display panel 2 can be made into a different shape, such as a circle, or a notch or the like can be added to the display panel 2.

When a plurality of light emitting elements LED are mounted on the backplane bp by the second processing step described above, a first lighting inspection is carried out to check whether the light emitting elements LED can be turned on normally.

Next, a repair process of light emitting elements LED is carried out (the third processing step). More specifically, for example, light emitting elements LED are provided for supplementation in the locations where they could not be mounted correctly in the second processing step described above, and further those light emitting elements LED that did not light up correctly in the first lighting inspection described above are replaced. FIG. 6 shows an example case where light emitting elements LED are mounted in the locations where the light emitting elements LED were not mounted correctly in the second processing step described above, and where some of the light emitting elements LED are missing.

The first to third processing steps described above may collectively be referred to as an LED chip transfer process. Here, when the LED chip transfer process is completed, as shown in FIG. 7, an array substrate is formed in which a plurality of light emitting elements LED are mounted on the backplane bp.

Note that after the completion of the repair of the light emitting element LEDs by the third processing step described above, but before the completion of the LED chip transfer process described above, a lighting inspection corresponding to the first lighting inspection may be carried out once again. If, in this lighting inspection, a light emitting LED is found to be not mounted properly at a right location or a light emitting LED that does not light properly is found, the third processing step described above may be carried out once again.

Then, when the LED chip transfer process is completed, a second lighting inspection is carried out to check whether the light emitting elements LED light up normally.

Figure 9:
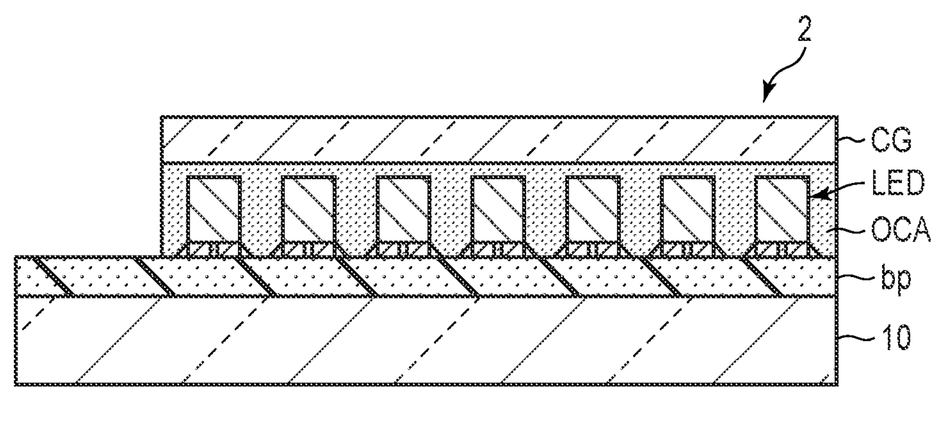
FIG. 9 is still another cross-sectional view illustrating the method for manufacturing the display device according to the embodiment.

Thereafter, the mounting process of the counter-substrate is carried out (the fourth processing step). More specifically, first, the adhesive layer OCA is attached to the first main surface CGA of the cover member CG. Then, as shown in FIG. 8, the counter-substrate including the cover member CG and the adhesive layer OCA is crimped onto the light emitting element LED. In this manner, the backplane bp and the cover member CG are bonded together by the adhesive layer OCA. Note that, at this point, the adhesive layer OCA contains air bubbles generated during the crimping process described above, and as a result, the backplane bp and cover member CG are not sufficiently bonded. In particular, as shown in FIG. 9, it is difficult to fill the adhesive layer OCA between adjacent light emitting elements LED, and bubbles (gaps) are generated due to the height of the light emitting elements LED.

Figure 10:
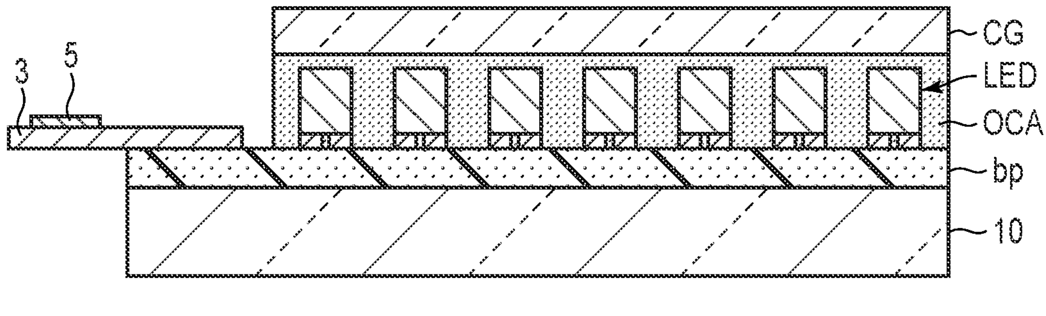
FIG. 10 is still another cross-sectional view illustrating the method for manufacturing the display device according to the embodiment.

As a solution to the above, autoclaving is carried out to bring the portion of the adhesive layer OCA to high pressure. Thus, as shown in FIG. 10, bubbles which may be created due to the height of the light emitting elements LED are eliminated, and therefore the space between adjacent light emitting elements LED can be filled with the adhesive layer OCA.

As described above, by the first to fourth processing steps, the display panel 2 is constituted. When the display panel 2 is constituted, a visual inspection is carried out to check whether or not there are any problems with its appearance.

Next, the mounting process of the various circuit boards is carried out (the fifth processing step). More specifically, as shown in FIG. 10, the first circuit board 3 is mounted on the terminal area MT of the display panel 2 by film-on glass (FOG). Further, the panel driver 5 is mounted on the first circuit board 3 by chip-on film (COF).

Alternatively, as described above, the panel driver 5 may as well be provided on the display panel 2. When the panel driver 5 is mounted on the display panel 2, similarly, after the cover member CG is attached to the display panel 2 in the fourth processing step, the panel driver 5 is mounted on the terminal area MT exposed from the cover member CG of the display panel 2, and further the first circuit board 3 is mounted on the terminal area MT of the display panel 2 in the fifth processing step. In this case, the panel driver 5 mounted on the display panel 2 does not overlap the cover member CG.

Note that the fourth and fifth processing steps may be carried out in a swapped order. In that case, it is preferable that a protective film be placed over the backplane bp and the light emitting elements LED before the fifth processing step. In this way, it is possible to prevent dirt and the like from attaching to the backplane bp during the fifth processing step. Note that the protective film should only be peeled off and removed before the fourth processing step.

Subsequently, the mounting process of the resin member 6 is carried out (the sixth processing step). More specifically, as shown in FIG. 11, the resin member 6 is applied to the display panel 2 so as to connect a side surface of the cover member CG, on a terminal area MT side and the portion of the first circuit board 3, that overlaps the terminal area MT in plan view, together, thus integrating the display panel 2 and the first circuit board 3. In this manner, the rigidity of the first circuit board 3 mounted on the terminal area MT can be reinforced, and it is possible to prevent the first circuit board 3 from breaking and being damaged.

After the sixth processing step described above, a third lighting inspection is carried out to check whether the light emitting elements LED light up normally.

After that, an attaching process of the support film F1 is carried out (the seventh processing step). More specifically, first, a laser beam of a predetermined frequency band is irradiated from the glass substrate 10 side toward the backplane bp. Thus, a peel-off layer, not shown in the figure, which fixedly adhering the backplane bp to the glass substrate 10, is sublimed by laser ablation, and as shown in FIG. 12, the glass substrate 10 is peeled off from the backplane bp. Thereafter, a support film F1 is attached to the first main surface bpA of the backplane bp. In this manner, the rigidity of the backplane bp can be reinforced while maintaining the flexibility of the backplane bp, and it is possible to prevent the display device 1 itself from being broken and damaged.

By performing the series of steps 1 to 7 described above, the display device 1 shown in FIG. 2 is manufactured.

In the following descriptions, advantageous effects of the method for manufacturing the display device 1 according to this embodiment will be described using a general manufacturing method for a display device as a comparative example. Note that the comparative example is provided to illustrate some of the effects that can be exhibited by the method for manufacturing the display device 1, and does not exclude the configuration and effects common to the comparative example and this embodiment from the scope of the present invention.

In the general manufacturing method for display devices, a polishing process is necessary to remove glass cullet generated in the cut-out process of the backplane bp. It should be noted here that, in a polyimide substrate such as the backplane bp of the display device 1 of this embodiment, various wiring patterns formed on the substrate are brittle and may not be able to withstand the polishing process described above and may be damaged undesirably.

By contrast, in the method for manufacturing the display device 1 of this embodiment, the backplane bp is cut out after attaching a protective film F2 to the surface of the backplane bp, and thus it is possible to prevent glass cullet from attaching to the surface of the backplane bp. Therefore, the polishing process described above can be omitted. For this reason, it is possible to prevent the switching elements and various wiring patterns formed on the backplane bp from being damaged by the polishing process described above.

Further, in the display device 1 of this embodiment, the display panel 2 and the first circuit board 3 are integrated with each other into one body by the resin member 6, and therefore it is possible to prevent the first circuit board 3 from being broken and damaged in the process until the display device 1 is manufactured.

Note that in this embodiment, in order to prevent the attachment of glass cullet to the surface of the backplane bp, the protective film F2 is attached to the surface of the backplane bp and then the backplane bp is cut out. But, the method to prevent the attachment of glass cullet to the surface of the backplane bp is not limited to this. In the following descriptions, another method that can prevent glass cullet from attaching to the surface of the backplane bp will be described with reference to FIG. 13.

Figure 13:
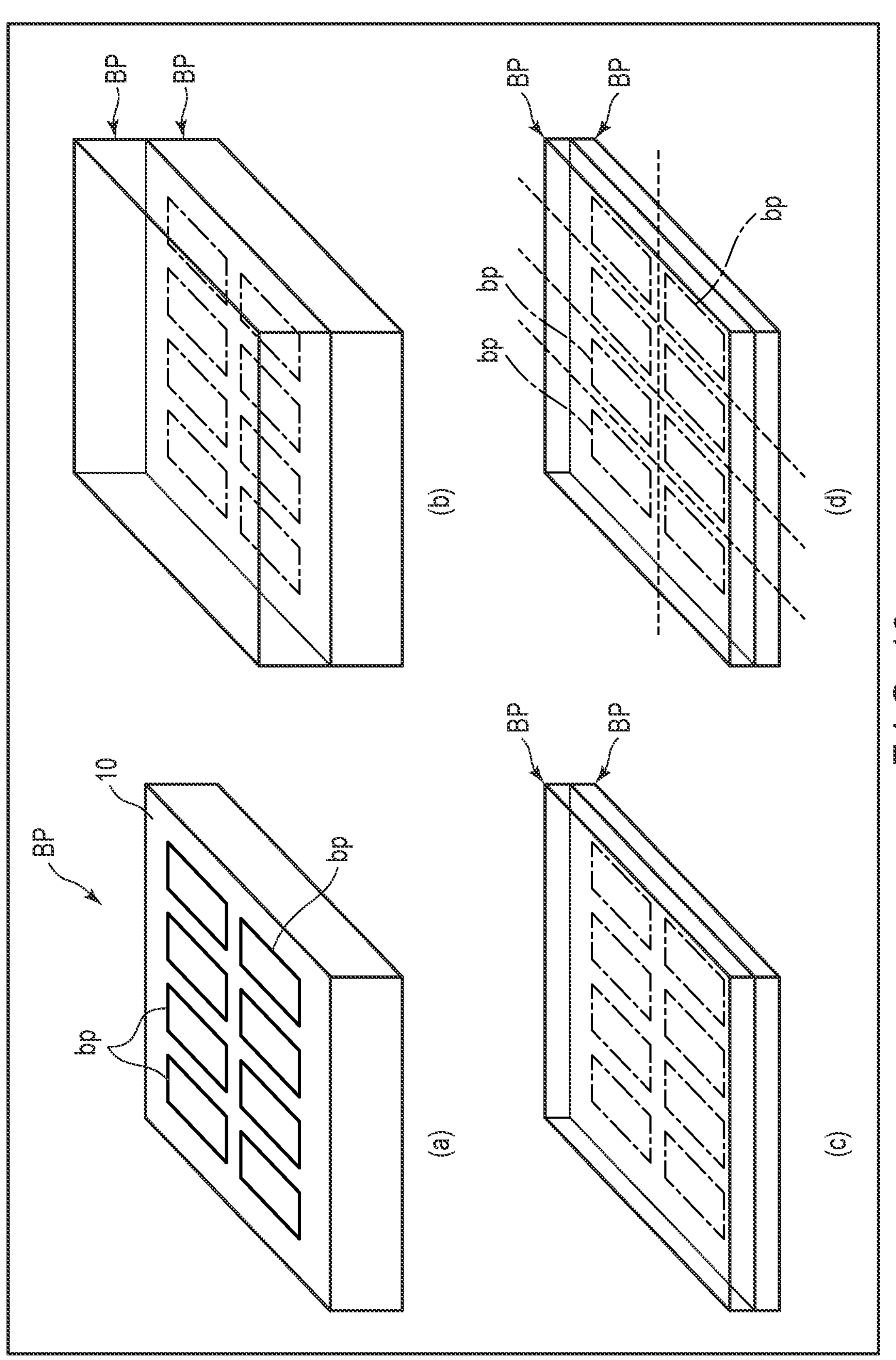
FIG. 13 is a plan view illustrating the method for manufacturing the display device according to the embodiment.

As shown in FIG. 13, parts (a) and (b), two large-sized backplanes BP are prepared, in each of which a number of backplanes bp are prepared on a glass substrate 10 before light emitting elements LED are mounted, and the two backplanes BP are bonded together in such a manner that these numerous backplanes bp in these two backplanes respectively oppose each other. After that, as shown in FIG. 13, part (c), the glass substrates 10 contained in the two backplanes BP are thinly shaved by slimming, and then, as shown in FIG. 13, part (d), the two backplanes BP are cut into individual pieces to form a number of backplanes bp.

In this case, the surface of the backplane bp contained in one backplane BP is covered by the respective backplane bp in the other backplane BP, and thus it is possible to prevent glass cullet from attaching to its surface. Further, according to the method shown in FIG. 13, twice as many backplanes bp can be formed at one time as compared to the method shown in FIG. 3, and thus, in addition to preventing the attachment of glass cullet, it is also possible to further improve the productivity.

The present embodiment provided above describes a case in which the light emitting elements LED mounted in the display device 1 (display panel 2) are of a type of micro-LEDs in which both the anode terminal AN and the cathode terminal CN are arranged side by side on one side of the light emitting layer LI, but the configuration is not limited to that of this case. For example, the light emitting elements LED may as well be of a type of micro-LEDs in which the anode terminal AN and the cathode terminal CN are arranged to oppose each other while interposing the light emitting layer LI therebetween. In the following descriptions, with reference to FIGS. 14 to 22, a method for manufacturing the display device 1 will be described in connection with the case where the light emitting elements LED are of a type of micro-LEDs in which the anode terminal AN and the cathode terminal CN are arranged to oppose each other while the light emitting layer LI is interposed therebetween.

First, when the backplane bp is formed by either one of the cut-out processes shown in FIG. 3 and FIG. 13, the mounting process of the light emitting element LED is carried out. More specifically, as shown in FIG. 14, a plurality of light emitting elements LED arranged on a sapphire substrate 20, which is the base substrate of the LED wafer, are mounted on the backplane bp. At this point, the light emitting elements LED are each constituted by a light emitting layer LI, an anode terminal AN and a cathode terminal CN. But it is either one of the anode terminal AN and the cathode terminal CN that is mounted on the backplane bp, and in this description, it is supposed that the anode terminal AN is mounted on the backplane bp. When a plurality of light emitting elements LED are mounted on the backplane bp, a laser beam of a predetermined wavelength band is irradiated from the sapphire substrate 20 side toward the plurality of light emitting elements LED, and as shown in FIG. 15, the sapphire substrate 20 is peeled off from the plurality of light emitting elements LED to expose the cathode terminals CN of the light emitting elements LED. When the sapphire substrate 20 is peeled off, chamfering is carried out to trim the outline of the display panel 2.

When the light emitting elements LED are mounted on the backplane bp, the first lighting inspection is carried out to check whether the light emitting elements LED light up normally. Note that, as described above, at this point, the cathode terminals CN of the light emitting element LEDs are not connected to the cathode electrodes CA to be provided on the backplane bp as described below. With this configuration, the first lighting inspection described above is carried out by temporarily connecting a cathode inspection substrate over the cathode terminals CN. The cathode inspection substrate is an external substrate different from the backplane substrate bp and comprises an inspection cathode electrode that shares a potential corresponding to the cathode potential. By pressing this cathode inspection substrate against the plurality of cathode terminals CN, the first lighting inspection is carried out.

Next, the repair process of the light emitting elements LED is carried out. More specifically, as shown in FIG. 16, for example, light emitting elements LED are provided for supplementation in the locations where they could not be mounted correctly in the mounting step of the light emitting elements LED described above, and further those light emitting elements LED that did not light up correctly in the first lighting inspection described above are replaced. Note that, after the repair process of the light emitting elements LED, a lighting inspection corresponding to the first lighting inspection is carried out once again, and if any locations where light emitting elements LED are not mounted properly or any light emitting elements LED that do not light up properly are found in the lighting inspection, the repair process of the light emitting elements LED may be carried out once again.

Subsequently, the mounting process of a planarization film (sealing film) and cathode electrodes CA is carried out. More specifically, first, a planarization film 30 is formed on the backplane BP. Note that the planarization film 30 is filled between adjacent light emitting elements LED. When the planarization film 30 is formed, as shown in FIG. 17, a cathode electrode CA is mounted thereon to connect the cathode terminals CN of the light emitting elements LEDs to each other. The cathode electrode CA is provided over a plurality of light emitting elements LED and is connected to the cathode potential in the peripheral area NDA of the backplane bp.

When the light emitting elements LED are micro-LEDs of the type in which the anode terminal AN and the cathode terminal CN are disposed to oppose each other while interposing the light emitting layer LI therebetween, the process up to this point corresponds to an LED chip transfer process.

After the LED chip transfer process is completed, a second lighting inspection is carried out to check whether the light emitting elements LED light up normally.

Then, the mounting process of the counter-substrate is carried out. More specifically, first, an adhesive layer OCA is attached to the first main surface CGA of the cover member CG. Then, the counter-substrate including the cover member CG and the adhesive layer OCA is crimped onto the cathode electrode CA. Thereafter, autoclaving is carried out to bring the portion of the adhesive layer OCA to a high pressure, and the display panel 2 shown in FIG. 18 is constituted.

Next, the mounting process of various circuit boards is carried out. More specifically, as shown in FIG. 19, the first circuit board 3 is mounted on the terminal area MT of the display panel 2 by FOG. Further, the panel driver 5 is mounted on the first circuit board 3 by COF.

The panel driver 5 may be provided on the display panel 2 as described above. Similarly, when the panel driver 5 is mounted on the display panel 2, after the cover member CG is attached to the display panel 2, the panel driver 5 is mounted on the terminal area MT exposed from the cover member CG of the display panel 2, and then the first circuit board 3 is mounted on the terminal area MT of the display panel 2. In this case, the panel driver 5 mounted on the display panel 2 does not overlap the cover member CG.

Next, the mounting process of the resin member 6 is carried out. More specifically, as shown in FIG. 20, the resin member 6 is applied to the display panel 2 to connect the side surface of the cover member CG on the terminal area MT side and the portion of the first circuit board 3, which overlaps the terminal area MT in plan view, thus integrating the display panel 2 and the first circuit board 3 with each other into one body.

After the mounting process of the resin member 6, a third lighting inspection is carried out to check whether the light emitting element LED lights up normally.

Figure 21:
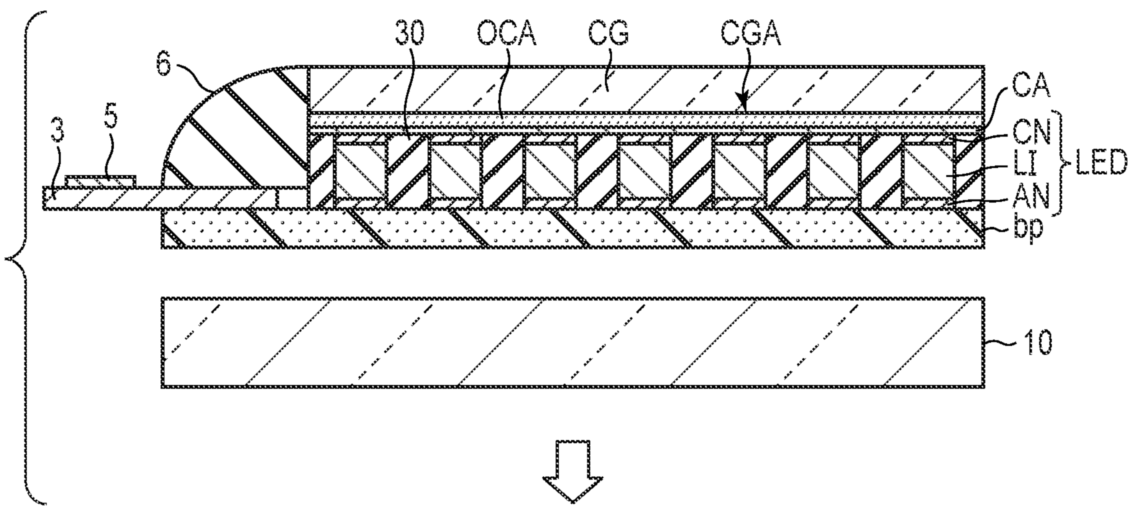
FIG. 21 is still another cross-sectional view illustrating the method for manufacturing the display device according to the embodiment.
Figure 22:
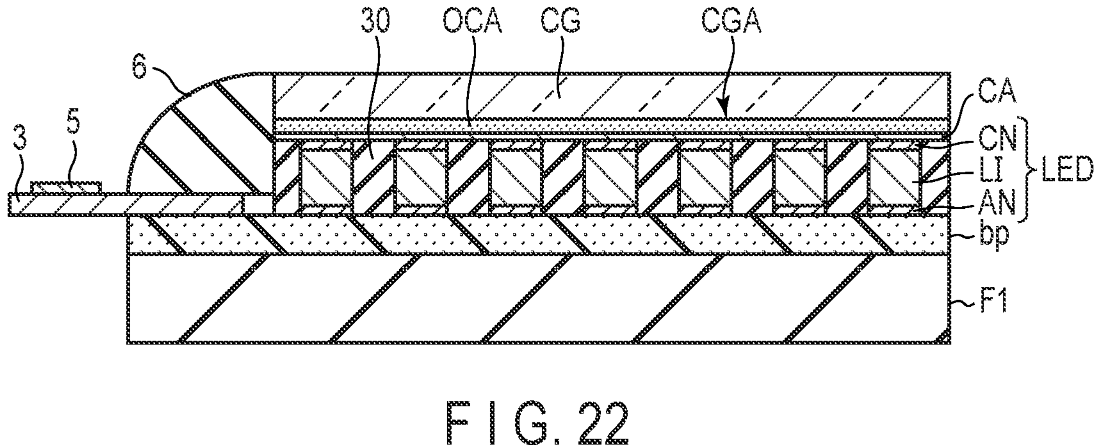
FIG. 22 is still another cross-sectional view illustrating the method for manufacturing the display device according to the embodiment.

After a while, the process of attaching the support film F1 is carried out. More specifically, a laser beam of a predetermined frequency band is irradiated from the glass substrate 10 side toward the backplane bp, and after the glass substrate 10 is peeled off from the backplane bp as shown in FIG. 21, the support film F1 is attached to the first main surface bpA of the backplane bp as shown in FIG. 22, thus constituting the display device 1.

As described above, in a series of manufacturing methods described with reference to FIGS. 14 to 22, the cutting process of the backplane bp and the mounting process of the resin member 6 are not different from the manufacturing methods described with reference to FIGS. 2 to 13, and thus, advantageous effects similar to those already described can be obtained.

Note that in the manufacturing method described above, it is assumed that the chamfering to trim the outline of the display panel 2 is carried out after the sapphire substrate 20 is peeled off from the plurality of light emitting elements LED, but the timing of chamfering is not limited to that of this method. For example, the chamfering may be carried out after the support film F is attached. In this manner, the chamfering can be carried out also on the cover member CG as well, there is no need to provide the cover member CG with a margin obtained by taking the outline tolerance into consideration. Thus, as compared to the case where the chamfering is carried out before the cover member CG is mounted, it is possible to achieve narrowing of frames.

According to one embodiment described above, a method for manufacturing the display device 1 can be realized in which a polishing process that would normally be required can be omitted and damaging does not easily occur during the manufacturing process. That is, according to this embodiment, it is possible to provide a method for manufacturing a micro-LED display, that can improve productivity (high productivity) and such a micro-LED display.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a display device, comprising:

attaching a protective film on a surface of a backplane including a plurality of flexible backplanes formed on a glass substrate;

cutting out the plurality of flexible backplanes from the backplane on which the protective film is attached;

peeling the protective film off from each of the flexible backplanes;

mounting a plurality of LED chips on the flexible backplane;

adhering a cover member to the flexible backplane on which the plurality of LED chips are mounted;

mounting a circuit board on a region of the flexible backplane, which does not overlap the plurality of LED chips and the cover member in plan view;

connecting a side surface of the cover member and a surface of the circuit board to each other with a resin member; and peeling the glass substrate off from the flexible backplane and attaching a support film thereto in place.

2. The manufacturing method of claim 1, further comprising chamfering to trim an outline of the flexible backplane prior to adhering the cover member.

3. The manufacturing method of claim 1, further comprising chamfering to trim outlines of the flexible backplane and the cover member after attaching the support film.

4. The manufacturing method of claim 1, wherein the plurality of LED chips are micro-LEDs in which both an anode terminal and a cathode terminal are arranged side by side on one surface of a light emitting layer.

5. The manufacturing method of claim 1, wherein the plurality of LED chips are micro-LEDs in which an anode terminal and a cathode terminal are arranged to oppose each other while interposing a light emitting layer therebetween.

6. The manufacturing method of claim 5, further comprising filling a planarization film between the plurality of LED chips after mounting the plurality of LED chips and mounting a cathode electrode over the plurality of LED chips on the planarization film.

7. A method for manufacturing a display device, comprising:

bonding two backplanes each including a plurality of flexible backplanes formed on a glass substrate so that the plurality of flexible backplanes oppose each other, respectively;

shaving glass substrate of the two backplanes;

cutting out the plurality of flexible backplanes from the two backplanes; and constituting a display device comprising a LED chip using the cut-out flexible backplane.

8. The manufacturing method of claim 7, further comprising:

mounting a plurality of LED chips on the flexible backplane;

adhering a cover member to the flexible backplane on which the plurality of LED chips are mounted;

mounting a circuit board on a region of the flexible backplane, which does not overlap the plurality of LED chips and the cover member in plan view;

connecting a side surface of the cover member and a surface of the circuit board with a resin member; and peeling the glass substrate off from the flexible backplane and attaching a support film thereon in place.

9. The manufacturing method of claim 8, further comprising chamfering to trim an outline of the flexible backplane prior to adhering the cover member.

10. The manufacturing method of claim 8, further comprising chamfering to trim outlines of the flexible backplane and the cover member after attaching the support film.

11. The manufacturing method of claim 8, wherein the plurality of LED chips are micro-LEDs in which both an anode terminal and a cathode terminal are arranged side by side on one surface of a light emitting layer.

12. The manufacturing method of claim 8, wherein the plurality of LED chips are micro-LEDs in which an anode terminal and a cathode terminal are arranged to oppose each other while interposing a light emitting layer therebetween.

13. The manufacturing method of claim 12, further comprising filling a planarization film between the plurality of LED chips after mounting the plurality of LED chips and mounting a cathode electrode over the plurality of LED chips on the planarization film.

* * * * *